United States Patent [19]

Leacock et al.

[11] Patent Number: 5,610,604
[45] Date of Patent: Mar. 11, 1997

[54] ANALOG TO DIGITAL CONVERTER PROVIDING VARYING DIGITAL RESOLUTION

[75] Inventors: Thomas J. Leacock, Mt. Laurel, N.J.; Robert J. Topper, Hatboro, Pa.

[73] Assignee: Panasonic Technologies, Inc., Princeton, N.J.

[21] Appl. No.: 350,953

[22] Filed: Dec. 7, 1994

[51] Int. Cl.⁶ ........................................... H03M 1/36
[52] U.S. Cl. ........................... 341/138; 341/118; 341/159
[58] Field of Search .................................... 341/200, 155, 341/118, 138, 158, 159

[56] References Cited

U.S. PATENT DOCUMENTS

| | | |
|---|---|---|
| 4,160,244 | 7/1979 | Solomon et al. . |
| 4,204,226 | 5/1980 | Mistretta et al. ...................... 358/111 |
| 4,216,465 | 8/1980 | Huelsman et al. . |
| 4,674,062 | 6/1987 | Premerlani . |
| 4,928,102 | 5/1990 | Katzenstein . |
| 4,983,973 | 1/1991 | Lewyn . |
| 4,990,913 | 2/1991 | Beauducel . |
| 4,990,917 | 2/1991 | Kohdaka . |
| 5,053,771 | 10/1991 | McDermott . |
| 5,059,980 | 10/1991 | Katzenstein . |
| 5,066,952 | 11/1991 | Koerner . |
| 5,225,837 | 7/1993 | Hosotani et al. . |
| 5,231,398 | 7/1993 | Topper . |
| 5,250,948 | 10/1993 | Berstein et al. . |
| 5,343,201 | 8/1994 | Takayama et al. ...................... 341/200 |

OTHER PUBLICATIONS

Dorf, Richard C., Ed., The Electrical Engineering Handbook, p. 777.

Primary Examiner—Jeffrey A. Gaffin
Assistant Examiner—Jason L. W. Kost
Attorney, Agent, or Firm—Ratner & Prestia

[57] ABSTRACT

An analog to digital converter which includes a resistive network for generating a number of first reference voltages related to each other by a first linear relationship and a number of second reference voltages related to each other by a second linear relationship, where the first linear relationship is different from the second linear relationship. Also included are first comparators which compare an analog signal to each one of the first reference voltages to produce specified first comparator signals where a respective comparator of the first comparators is provided for each of the first reference voltages. Second comparators are provided to compare the analog signal to each of the second reference voltages to produce second comparator signals where a respective comparator of the second comparators is provided for each one of the second reference voltages. Also included is an encoder to directly convert the first comparator signals and the second comparator signals to a linear digital encoded signal having respecting different quantization resolutions in different parts of its range.

9 Claims, 7 Drawing Sheets

ANALOG TO DIGITAL CONVERTER PROVIDING VARYING DIGITAL RESOLUTION

FIELD OF THE INVENTION

The present invention generally relates to analog to digital converters and, more particularly, to an analog-to-digital converter having different quantization resolution in different parts of its range.

BACKGROUND OF THE INVENTION

The conventional parallel flash analog-to-digital (A/D) converter used to digitize video signals is shown in FIG. 5. The flash A/D converter produces 256 digital codes, words, corresponding to 256 equally spaced analog input voltages.

The conventional flash A/D converter 50 operates by comparing the input analog signal against a large number of linearly increasing reference voltage levels in parallel. A 8-bit flash A/D converter includes 255 distinct analog voltage comparators 20. An encoder 30 produces a digital signal ENC-OUT in response to one of the comparators 20(1)–20(255) with the highest reference voltage that is not less than the voltage level of a given input analog signal. The output produced by the comparators is provided to the input terminals I(0) to I(255) of the encoder 30.

The flash A/D converter 50 includes resistors 10(1) to 10(255) connected in series between a ground GND and a reference voltage VREF. Coupled between each pair of resistors is a comparator 20(1)–20(255) which is also coupled to an analog input signal AIN. The input terminals of comparators 20(1)14 20(255) are connected in parallel to the same analog input signal AIN so that the same analog voltage appears on the additive input terminal of each comparator. The subtractive input terminals of comparators 20(1) to 20(255) are coupled to respective reference voltage levels which are generated by resistors 10(1) to 10(255) connected in series.

Resistors 10(1) to 10(255) are ideally of equal value and, thus, for a given current, produce equally spaced reference voltages. That is to say, the reference voltages between ground GND and the respective subtractive input terminal of comparators 20(1)–20(255) increase in equal increments. Assuming the reference voltage at the subtractive input terminal of comparator 20(1) is A, for example, then the reference voltage at the subtractive input terminal of comparators 20(2) and 20(255) are 2 A and 255 A respectively.

The logic signals produced by comparators 20(1) to 20(255) are applied to input terminals I(1) to I(255). The comparator signals are used by the encoder 30 to produce one of 256 different digital codes which are provided to a latch 40 as an eight bit parallel digital signal. In response to a clock signal CLK, latch 40 provides a 8-bit digital signal DOUT.

The number of comparators 20 for the conventional parallel flash A/D converter 50 doubles with each increment in bit resolution so that building a very high resolution flash converter becomes unreasonable. For example, if the digital resolution is increased by a factor of two, then the number of comparators is increased to 511.

When the resolution of the A/D converter shown in FIG. 5 is increased, the sample points over the analog signal to be converted are desirably equally spaced. Thus, resolution is desirably increased uniformly. This occurs because the resistors 10(1)–10(255) have equal resistances and provide the same reference voltage drop across that resistance.

FIG. 6 illustrates the resolution of the conventional A/D converter. The digital codes are on the x-axis and the input analog signal scaled to 256 voltage levels are the y-axis.

There are times, however, when equally spaced sample points for the analog input voltages are not necessary. For example, CCD sensors may have more total noise at levels near white than at those near black and since the desired digital resolution is a function of the analog noise of the sample signal, coarser quantization may be tolerated near white (i.e., any quantization distortion in the signal is masked by the noise).

In addition to noise, video applications are increasingly requiring higher speeds for converting and processing images as, for example, is required for high definition television (HDTV). For example, as the speed of camera systems increase to provide video for HDTV, the power consumption of the camera systems increase. As a result, the power consumption of the camera system becomes a speed limiting factor for the camera systems. Accordingly, when the power consumption of the camera system can be reduced, higher speeds may be attained.

Coarser quantization can be performed by simply disregarding unneeded levels produced by A/D converter 50. Since there is no reduction in circuitry, this offers no advantage over the system which uses all available codes. In addition, the simple limitation does not produce advantages such as power dissipation and increased conversion speed.

An alternative A/D is shown in U.S. Pat. No. 5,066,952 entitled NON-LINEAR DATA CONVERSIONS SYSTEM FOR DYNAMIC RANGE DIGITAL SIGNAL PROCESSING issued to Koerner, which illustrates a method for performing non-linear conversion. In the '952 patent, the conventional A/D converter shown in FIG. 5 is modified to provide a proportionally larger number of comparators to accommodate high resolution requirements. The resistors 10(1)–10(255) are of graduated, unequal values. For example, the resistor values may be related as a geometric progression. As a result, the A/D conversion process provides a form of data compression which results in an A/D conversion that is non-linear. In the '952 patent an additional read only memory (ROM) is provided to decompress the digital data which has been compressed in the A/D converter. The A/D converter of the '952 patent does not reduce power consumption and actually increases the complexity of the system. This occurs because an additional component, the mapping read-only-memory, is required to convert the non-linear digital signal provided by the A/D converter to a linear digital signal. This extra component may also increase power dissipation.

Another conventional A/D is shown in U.S. Pat. No. 5,053,771, entitled ADAPTIVE DUAL RANGE ANALOG TO DIGITAL CONVERTER, issued to McDermott (hereinafter the '771 patent). The '771 discloses an adaptive dual range A/D converter which includes an input signal range selection device for selecting a segment of the input analog signal to be converted to digital form using fine resolution quantization. The '771 patent, however, uses two A/D converters to provide coarse resolution and fine resolution. The digital words produced by the coarse and fine A/D converters is provided to a multiplexer which, then, selects the outputs of the coarse and fine A/D converters. In this case, however, two A/D converters are provided as well as a multiplexer to perform the A/D conversion.

Accordingly, there is a need for an analog to digital converter which performs linear A/D conversion combined with non-linear resolution levels providing lower power dissipation for higher speed applications.

SUMMARY OF THE INVENTION

To achieve these and other objects, and in view of its purposes, the present invention provides an analog to digital converter including a resistive network which generates a number of first reference voltages related to each other by a first linear relationship and a number of second reference voltages related to each other by a second linear relationship. The first linear relationship is different from the second linear relationship. Also included are first comparators which compare an analog signal to each one of the first reference voltages to produce specified first comparator signals where a respective comparator of the first comparators is provided for each of the first reference voltages. Second comparators are also provided to compare the analog signal to each of the second reference voltages to produce second comparator signals where a respective comparator of the second comparators is provided for each one of the second reference voltages. An encoder directly converts the first comparator signals and the second comparator signals to a linear digital encoded signal having different quantization resolution for different parts of its range.

BRIEF DESCRIPTION OF THE DRAWINGS

The invention is best understood from the following detailed description when read in connection with the accompanying drawings, in which.

DETAILED DESCRIPTION OF THE INVENTION

Figure 1:
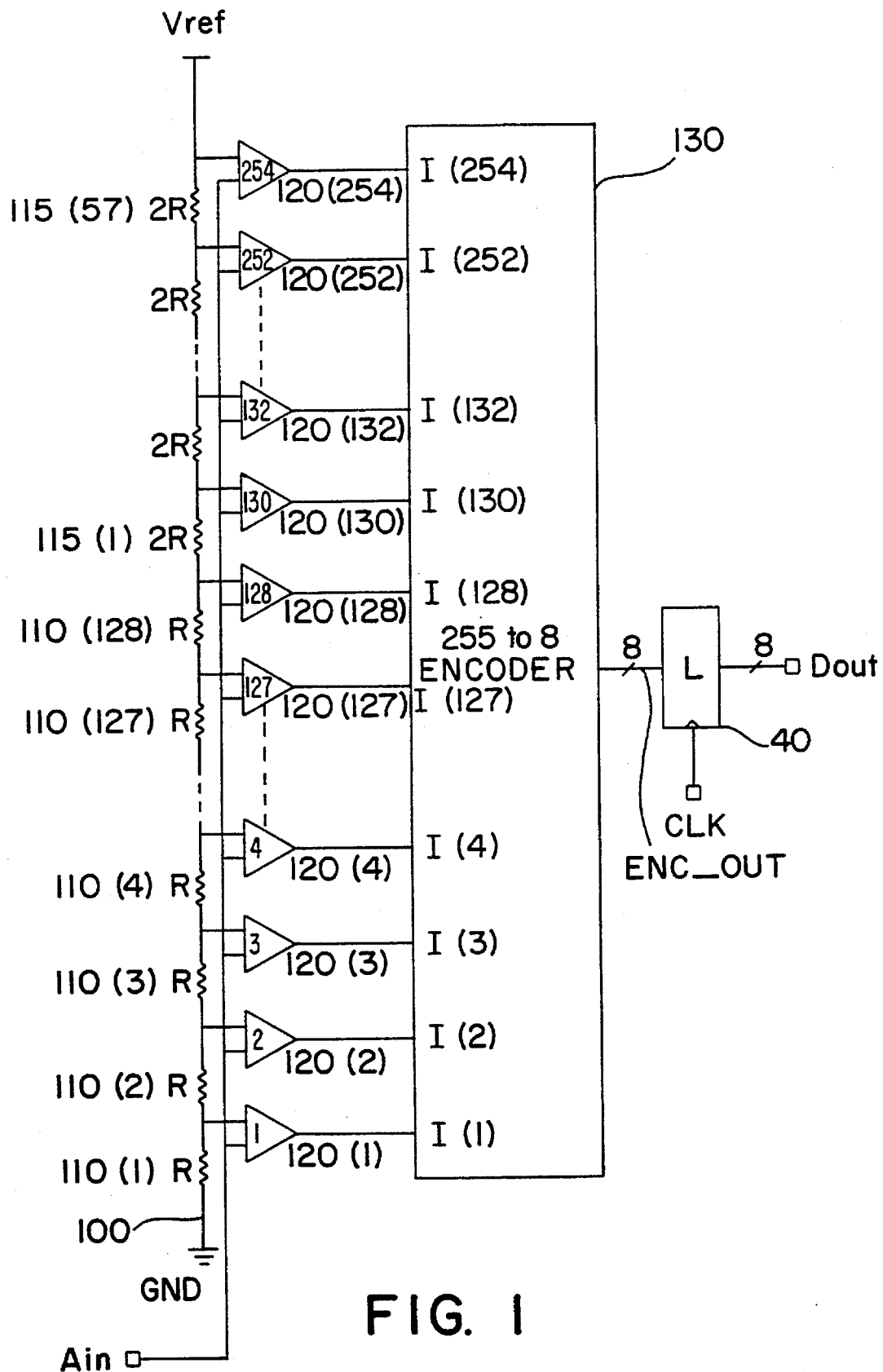
FIG. 1 is a circuit diagram partly in block diagram form of an exemplary A/D converter.

In general terms, the A/D converter operates by providing varying resolution for a video signal. The A/D converter includes comparators coupled between a resistive network and an encoder where some of the comparators corresponding to levels or samples of the analog signal which are not needed are eliminated. The resistances between remaining comparators adjacent to the position of an eliminated comparator are increased. As a result, the linearity of the produced digital signal is not affected and reduced power consumption is realized.

The exemplary A/D converter discussed below converts an input analog signal to an 8-bit digital signal. An A/D converter according to the invention, however, can covert the analog signal to an n-bit digital signal where n is an integer.

The analog-to-digital converter receives an analog signal AIN which is provided to comparators 120(1)–120(254). In the exemplary embodiment, there are 188 comparators where the reference numerals for the comparators increases by an increment of one from comparator 120(1) to 120(128) and by an increment of two from 120(128).

Each comparator 120(1)–120(254) is coupled to a corresponding input terminal I(1)–I(254) of encoder 130 having the same corresponding reference number. For example, comparators 120(2), 120(3), 120(128), 120(130), and 120(132) are coupled to input terminals I(2), I(3), I(128), I(130), and I(132), respectively. This assumes that the encoder has an input terminal and a corresponding digital code to produce 255 digital codes. Alternatively, the input terminals and the corresponding digital codes and associated circuitry of the encoder which are not coupled to a comparator can be eliminated.

Comparators 120(1)–120(254) are coupled to resistive network 100 between resistors 110(1)–110(128) and resistors 115(1)–115(57). Resistors 110(1)–110(128) and resistors 115(1)–115(57) are coupled in series.

Comparators 120(1)–120(254) provide a logic signal to the respective input terminals I(1) to I(254) when an analog signal AIN is provided to each comparator. In response to the logic signals applied to input terminals I(1) to I(254), encoder 130 produces one of a possible 185 digital codes. Since the encoder is provided 185 reference voltages from the 185 comparators, it produces only 185 8-bit digital codes of a possible 255 8-bit digital codes.

Figure 2:
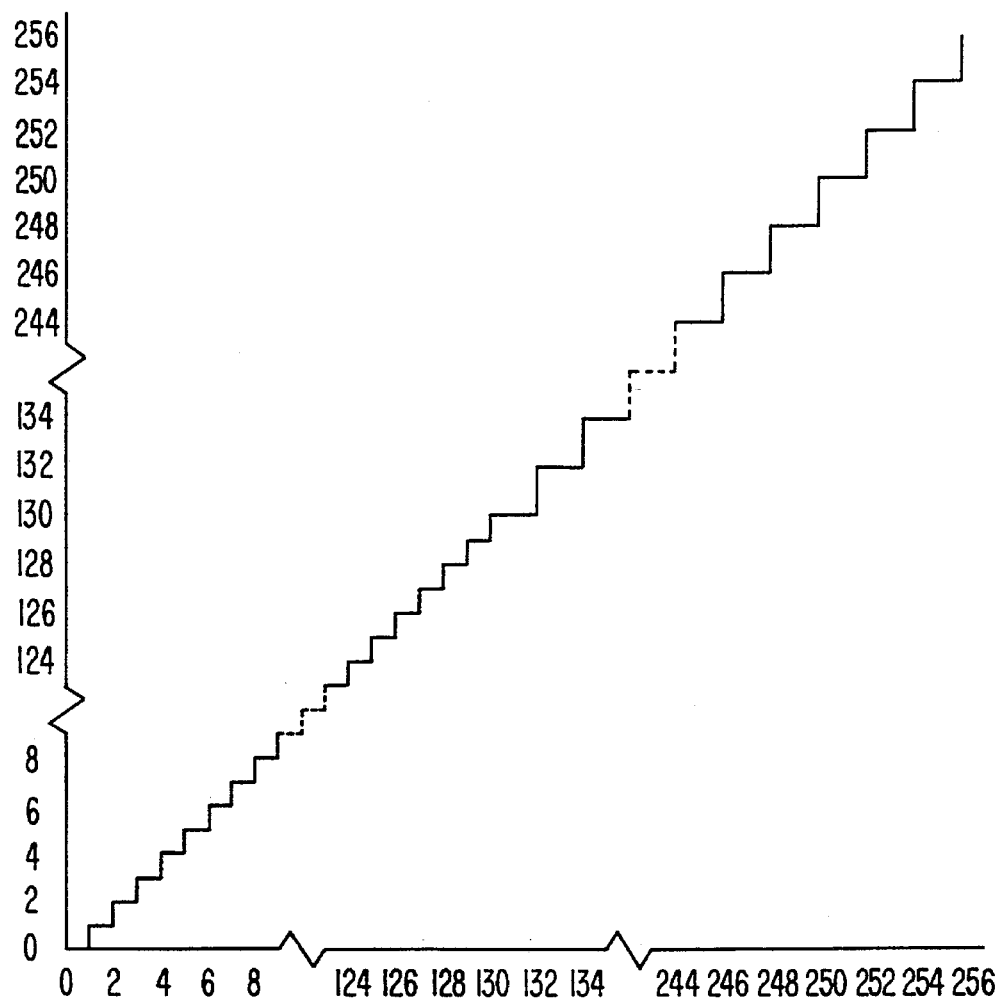
FIG. 2. is a graph showing the bit resolution distribution of an analog signal which has been converted to a digital signal using the A/D converter shown in FIG. 1.

The quantization resolution of the A/D converter of FIG. 1 is shown in FIG. 2. FIG. 2 shows resolution of the reference voltages provided to the encoder against the digital codes produced. The possible digital codes are shown on the x-axis and the input analog signal scaled to 256 voltage levels is shown on the y-axis. Where the analog signal to be digitized is a video signal, the A/D converter has full quantization resolution near black and decreased resolution near white. Notwithstanding, the linearity of the digital signal has not been affected. This is accomplished by eliminating digital codes in the upper part of the range as the resistance is changed from resistors 110 to resistors 115.

Accordingly, reduced power consumption is realized because, in the exemplary embodiment, 25% of the comparators used for the digital to analog conversion are eliminated and the linearity of the conversion is maintained without adding additional circuitry to compensate for a non-linear conversion.

Figure 3:
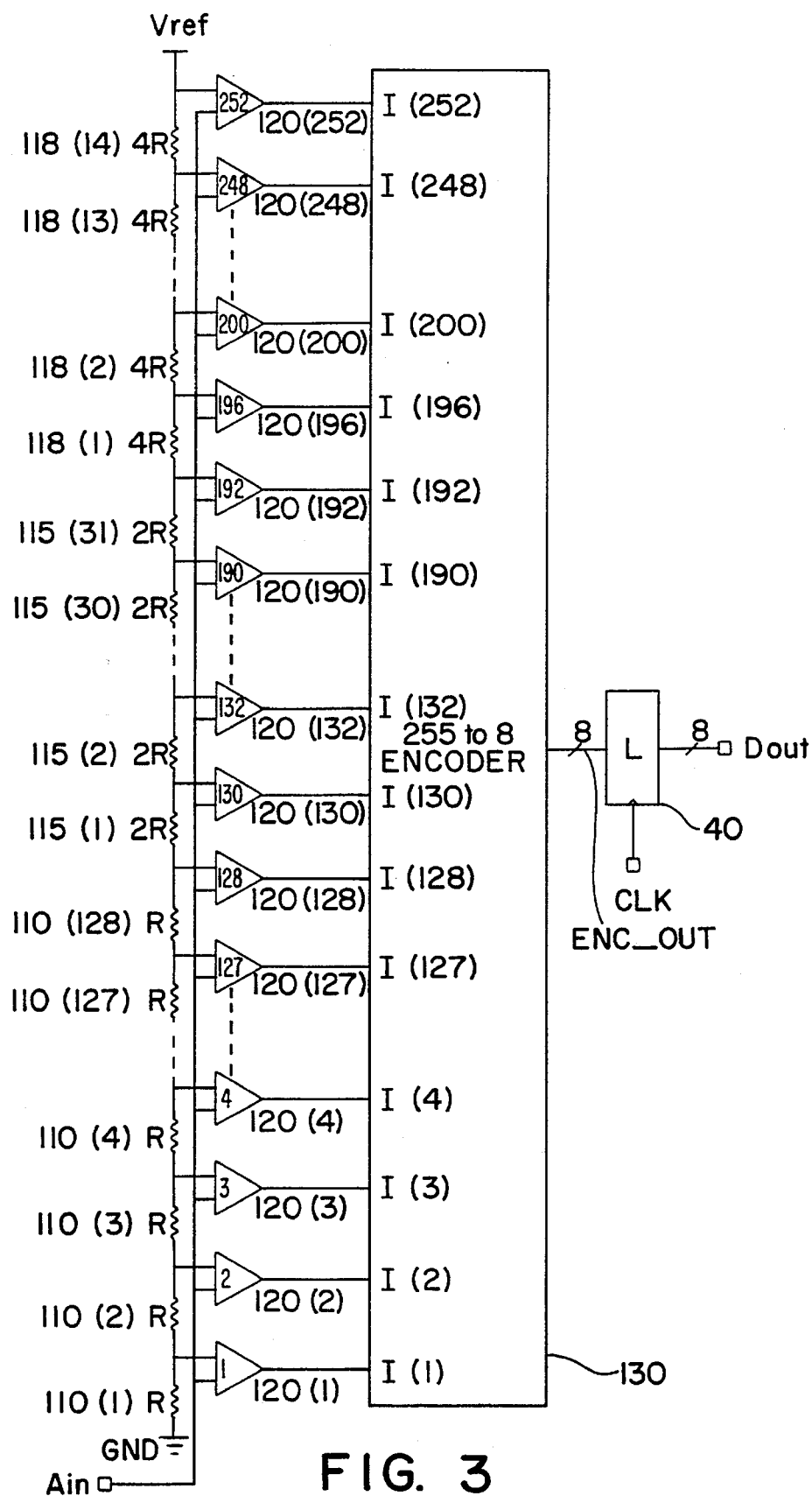
FIG. 3 is a circuit diagram partly in block form of another exemplary A/D converter according to the present invention.

FIG. 3 shows an alternative exemplary embodiment of the present invention. In this case the resistive network has been broken into three segments with three different resolution levels. A third group of resistors having a resistive value of 4R is provided between comparators 120(192) to 120(252). Instead of preserving every other comparator, only every fourth comparator is preserved from comparator 120(192) to 120(252). As in the first exemplary embodiment, this embodiment eliminates digital codes and comparators as the resistive value between comparators is increased.

Figure 4:
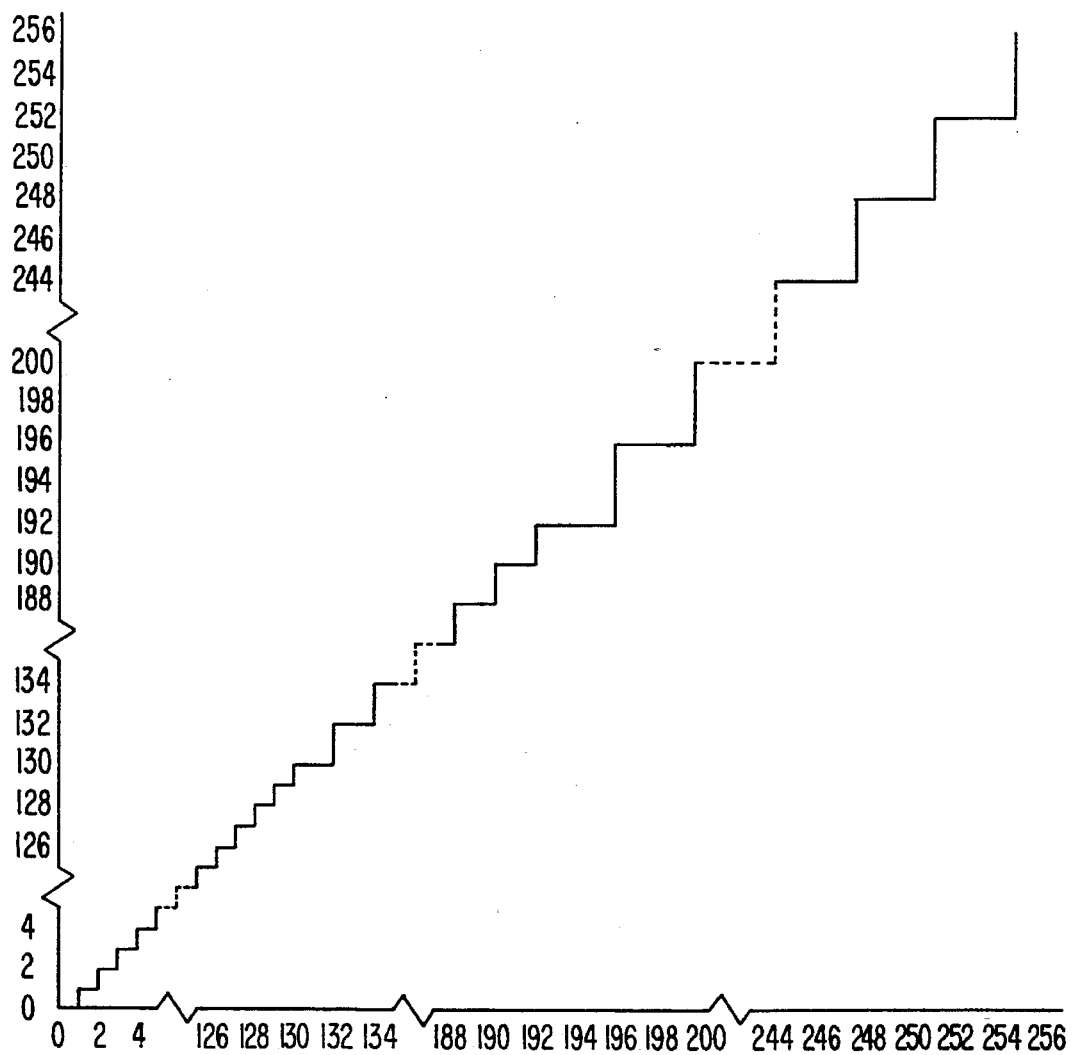
FIG. 4 is a graph showing the bit resolution distribution of an analog signal which has been converted to a digital signal using the A/D converter shown in FIG. 3.
Figure 5:
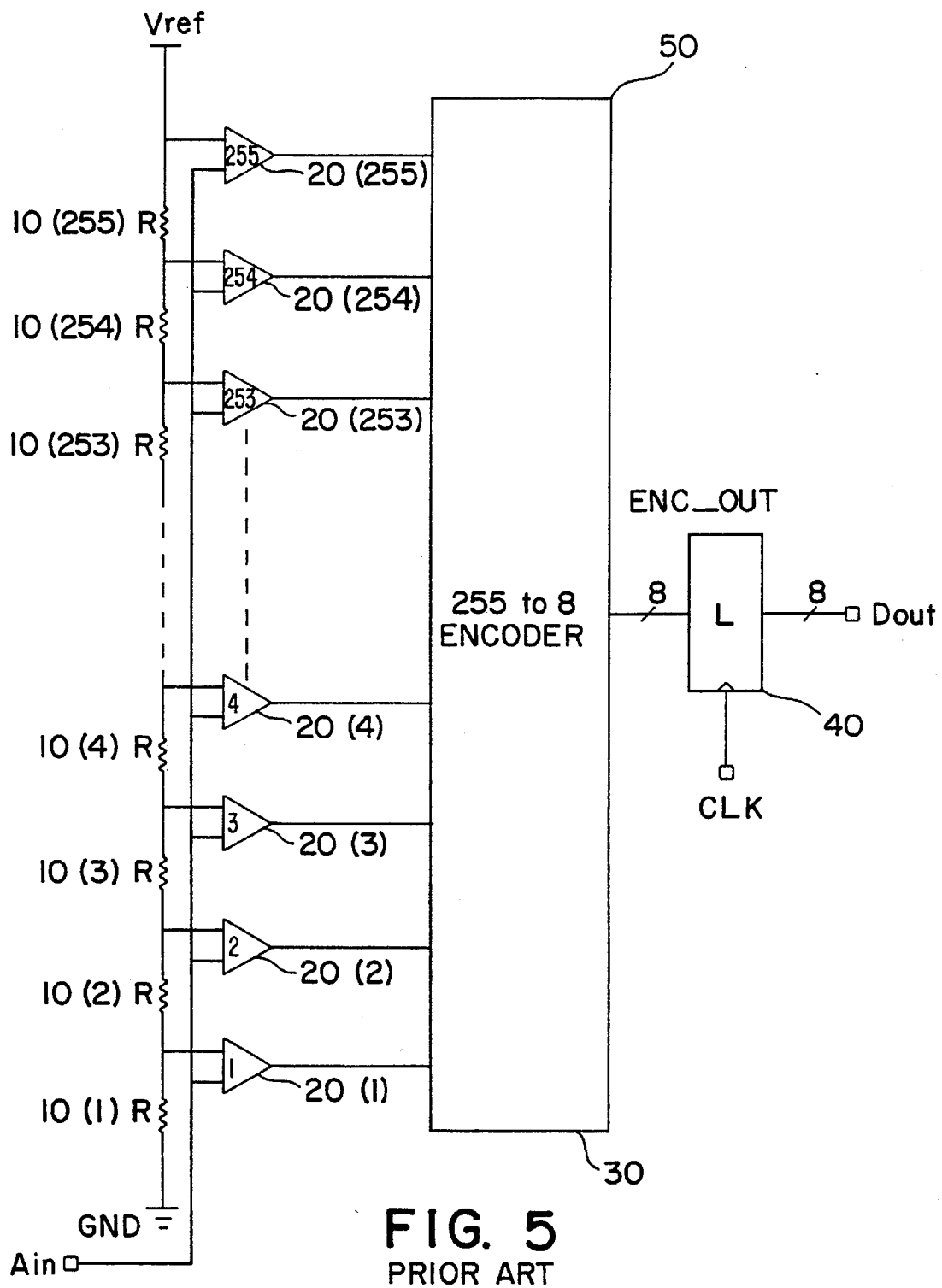
FIG. 5 (prior art) is a circuit diagram partly in block form of a conventional A/D converter.
Figure 6:
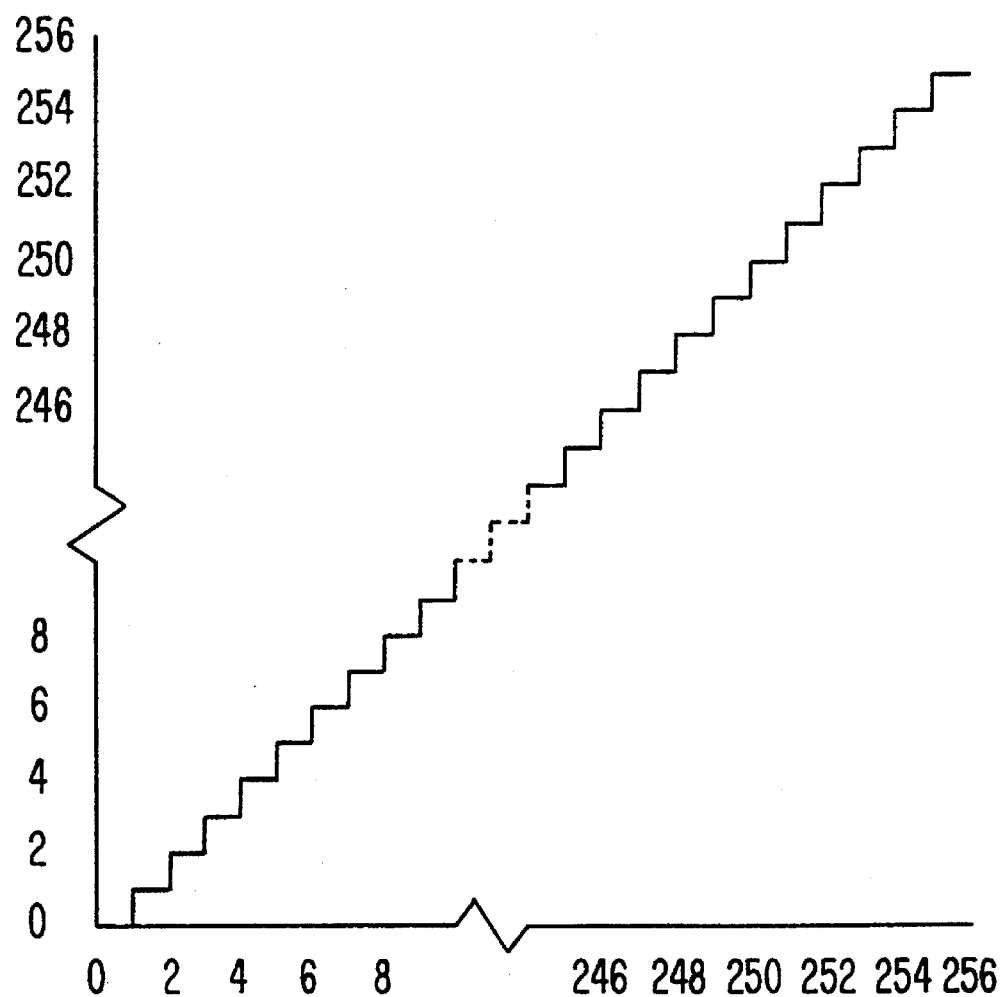
FIG. 6 (prior art) is a graph of the bit resolution distribution of an analog signal which has been converted to a digital signal using the conventional A/D converter shown in FIG. 5.

In FIG. 3 resistors 110 have a resistive value of R, resistors 115 have a resistive value of 2R, and resistors 118 have a resistive value of 4R. As a result, the voltages applied to the subtractive input terminals of the comparators 120 increase by increments of M volts to 2 times M volts to 4 times M volts. The input video signal has full resolution for the lowest 30% of the voltage range of the video signal, half resolution for the next 30% of the voltage range of the video signal, and one quarter resolution for the remaining 40% of the voltage range of the video signal by altering the resistive network in this fashion. The quantization resolution of the A/D converter in FIG. 3 is shown in FIG. 4. The digital codes are shown on the x-axis and the input analog signal scaled to 256 voltage levels is shown on the y-axis.

Alternatively, other bit resolution distributions are possible. These alternate bit resolutions can be accomplished by altering the resistive values of the resistive network and eliminating corresponding comparators for the resistive values which are eliminated. These eliminated comparators may be in other parts of the range of the A/D converter. In addition, reduced power dissipation is realized as the number of comparators is reduced.

Figure 7:
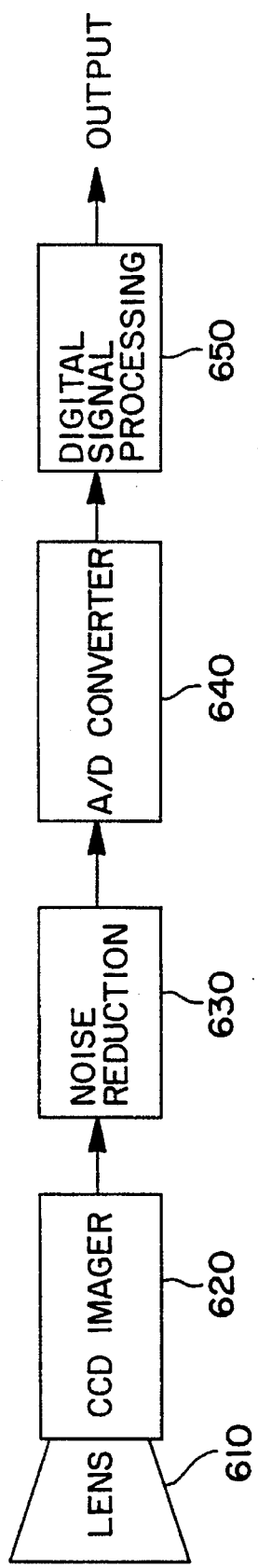
FIG. 7 is a block diagram of a camera system including an A/D converter according to an exemplary embodiment of the present invention.

FIG. 7 is a block diagram of a camera system including A/D converter 640 according to an exemplary embodiment of the present invention.

The camera system receives an image through lens 610. The image is converted to an analog image signal by the Charge-Coupled Device (CCD) imager 620. The analog image signal is provided to a noise reduction circuit 630 to reduce the noise in the analog image signal. The analog image signal is then provided to an A/D converter 640 which converts the analog image signal to a digital image signal that can then be processed by the digital signal processor 650.

Although the analog image signal undergoes noise reduction at the noise reduction circuit 630, noise can still be present in the analog image signal. Particularly, CCD imager circuits produce shot noise in the analog image signal. Shot noise is random noise which increases as the analog input image light level increases.

A/D converter 640 provides both decreased resolution for the elevated light level, near white, and reduced power consumption. A/D converter 640 is, for example, the A/D converter according to the first exemplary embodiment of the present invention. Decreased power consumption is realized by providing fewer comparators. Since the power consumption of the camera system can be reduced, higher A/D conversion speeds may be attained.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An analog to digital converter comprising:

means for generating a plurality of first reference voltages related to each other by a first linear relationship and a plurality of second reference voltages related to each other by a second linear relationship, the first linear relationship being different from the second linear relationship;

a plurality of first comparators which compare an analog signal to each one of the plurality of first reference voltages to produce a specified plurality of first comparator signals where a respective one comparator of the plurality of first comparators is provided for each one of the plurality of first reference voltages;

a plurality of second comparators for comparing the analog signal to each one of the plurality of second reference voltages to produce a specified plurality of second comparator signals where a respective one comparator of the plurality of second comparators is provided for each one of the plurality of second reference voltages; and means for directly converting the specified plurality of first comparator signals and the specified plurality of second comparator signals to a linear digital encoded signal having respectively different quantization resolutions in different parts of its range.

2. The digital to analog converter as recited in claim 1, wherein each one of the plurality of first comparators defines a first uniform step conversion and each one of the plurality of second comparators defines a second uniform step conversion.

3. The digital to analog converter as recited in claim 2, wherein the means for producing the first plurality of voltages and the second plurality of voltages includes a resistive network having a first set of resistors each having a first resistance value and a second set of resistors each having a second resistance value which is an integer multiple of the first resistance value.

4. The digital to analog converter as recited in claim 1, wherein the plurality of second comparators is smaller in number than the plurality of first comparators and wherein each one of the plurality of first comparators defines a first uniform step conversion and each one of the plurality of second comparators defines a second uniform step conversion.

5. The digital to analog converter as recited in claim 1, wherein the means for directly converting the plurality of first comparator signals and the plurality of second comparator signals to a linear digital encoded signal having varying resolution is a digital encoder.

6. An analog to digital converter comprising:

a plurality of resistors coupled in series between a first voltage level and a second voltage level, the plurality of resistors including a first plurality of resistors having a first resistive value and a second plurality of resistors having a second resistive value, the second resistive value being different from the first resistive value, each one of the first and second plurality of resistors producing one of a plurality of reference voltages, respectively;

a plurality of comparators each having a first terminal for receiving an analog signal and a second terminal coupled between respective ones of the plurality of resistors for receiving a respective one of the plurality of reference voltages, where there is a one-to-one correspondence between the plurality of reference voltages and the plurality of comparators; and a linear encoder coupled to receive signals produced by the plurality of comparators.

7. The analog to digital converter as recited in claim 6, wherein the plurality of comparators has a first group of comparators and a second group of comparators and wherein a number of comparators in the first group of comparators is less than a number of comparators in the second group of comparators for defining an equal step conversion and wherein each comparator of the first group of comparators defines a first uniform step conversion and each comparator of the second group of comparators defines a second uniform step conversion.

8. The digital to analog converter as recited in claim 6, wherein the plurality of comparators has a first group of comparators and a second group of comparators and wherein each comparator of the first group of comparators defines a first uniform step conversion and each comparator of the second group of comparators defines a second uniform step conversion.

9. In a camera system including an analog to digital converter and means for converting an input image to an analog image signal having signal levels which range between a white level and a black level, the analog to digital converter comprising:

means for generating a plurality of first reference voltages related to each other by a first linear relationship and a plurality of second reference voltages related to each other by a second linear relationship, the first linear relationship being different from the second linear relationship;

a plurality of first comparators which compare the analog image signal to each one of the plurality of first reference voltages to produce a specified plurality of first comparator signals where a respective one comparator of the plurality of first comparators is provided for each one of the plurality of first reference voltages, each one of the plurality of first comparators defines a first uniform step conversion for the signal levels including the black level;

a plurality of second comparators for comparing the analog image signal to each one of the plurality of second reference voltages to produce a specified plurality of second comparator signals where a respective one comparator of the plurality of second comparators is provided for each one of the plurality of second reference voltages, each one of the plurality of second comparators defines a second uniform step conversion for the signal levels including the white level; and means for directly converting the plurality of first comparator signals and the plurality of second comparator signals to a linear digital encoded signal having higher quantization resolution for the specified plurality of first comparator signals and lower quantization resolution for the specified plurality of second comparator signals.

* * * * *